US011769518B2

(12) United States Patent
Mitsuda et al.

(10) Patent No.: US 11,769,518 B2
(45) Date of Patent: Sep. 26, 2023

(54) SOUND ANALYSIS SYSTEM, SOUND ANALYSIS METHOD, AND PROGRAM

(71) Applicant: Toyota Jidosha Kabushiki Kaisha, Toyota (JP)

(72) Inventors: Eiji Mitsuda, Nagoya (JP); Hikaru Sugata, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 144 days.

(21) Appl. No.: 17/409,006

(22) Filed: Aug. 23, 2021

(65) Prior Publication Data

US 2022/0068292 A1 Mar. 3, 2022

(30) Foreign Application Priority Data

Aug. 25, 2020 (JP) ................................ 2020-141396

(51) Int. Cl.
*H03G 3/20* (2006.01)
*H04R 3/00* (2006.01)
*G10L 21/034* (2013.01)

(52) U.S. Cl.
CPC .............. *G10L 21/034* (2013.01); *H04R 3/00* (2013.01)

(58) Field of Classification Search
CPC . H04R 3/00; H03G 5/025; H03G 7/00; H03G 3/20
USPC .......................... 381/92, 104, 106, 110, 122
See application file for complete search history.

(56) References Cited

U.S. PATENT DOCUMENTS

2013/0080168 A1* 3/2013 Iida ........................ G01S 5/183 704/E17.001
2016/0064012 A1 3/2016 Endo
2018/0054683 A1* 2/2018 Pedersen ............. H04R 25/554

FOREIGN PATENT DOCUMENTS

JP 2016-048302 A 4/2016
JP 6191747 B2 9/2017

* cited by examiner

*Primary Examiner* — George C Monikang
(74) *Attorney, Agent, or Firm* — Dinsmore & Shohl LLP

(57) ABSTRACT

A sound analysis system includes: first and second sound pressure acquisition means for respectively acquiring a sound pressure of a voice of a user and disposed in an equipment worn by the user at positions that differ in a distance from a mouth of the user under the state in which the user is wearing the equipment; distance estimation means for estimating a distance between either the first or the second sound pressure acquisition means and the mouth of the user based on the acquired sound pressures; and sound pressure correction means for calculating a difference between a reference value of the distance between the first or the second sound pressure acquisition means and the mouth of the user and the estimated distance, and correcting at least one of the sound pressures acquired by the first and the second sound pressure acquisition means based on the calculated difference.

7 Claims, 10 Drawing Sheets

| SOUND PRESSURE $v_1$ | SOUND PRESSURE $v_2$ | DISTANCE R |
|---|---|---|
| 3.0 | 2.9 | 4.1cm |
| 3.0 | 2.8 | 4.2cm |
| 3.1 | 2.9 | 4.5cm |
| ⋮ | ⋮ | ⋮ |

Fig. 5

| DIFFERENCE ΔR | CORRECTION AMOUNT Δv |
|---|---|
| 0.5cm | 0.1 |
| 1.0cm | 0.2 |
| 1.5cm | 0.4 |
| ⋮ | ⋮ |

Fig. 6

SOUND ANALYSIS SYSTEM, SOUND ANALYSIS METHOD, AND PROGRAM

CROSS REFERENCE TO RELATED APPLICATIONS

This application is based upon and claims the benefit of priority from Japanese patent application No. 2020-141396, filed on Aug. 25, 2020, the disclosure of which is incorporated herein in its entirety by reference.

BACKGROUND

The present disclosure relates to a sound analysis system, a sound analysis method, and a program.

A voice analysis system including two sound pressure sensors disposed at different distances from a user's mouth such as a wearable terminal hung from the user's neck is disclosed (e.g. Japanese Patent No. 6191747). The voice analysis system determines whether the source of the sound pressures is the utterance of the user or the utterance of those around the user based on the ratio of the sound pressure acquired by one of the sound pressure sensors to the sound pressure acquired by the other of the sound pressure sensors.

SUMMARY

Due to reasons such as twisting of a strap on which the sound pressure sensors are hung and the like, the distance between each of the sound pressure sensors and the user's mouth may change, causing the sound pressure acquired by each sound pressure sensor to change. In such case, the accuracy of the detection of the sound pressures may be degraded, leading to degradation in the accuracy of the voice analysis.

The present disclosure has been made to solve the problem mentioned above. An object of the present disclosure is to provide a sound analysis system, a sound analysis method, and a program that can suppress degradation in the accuracy of the detection of the sound pressure and perform sound analysis with high precision.

An aspect of the present disclosure for attaining the aforementioned object is a sound analysis system including:

first and second sound pressure acquisition means for respectively acquiring a sound pressure of a voice of a user and disposed in an equipment worn by the user at positions that differ in a distance from a mouth of the user under the state in which the user is wearing the equipment;

distance estimation means for estimating a distance between either the first or the second sound pressure acquisition means and the mouth of the user based on the sound pressures acquired by the first and the second sound pressure acquisition means; and sound pressure correction means for calculating a difference between a reference value of the distance between the first or the second sound pressure acquisition means and the mouth of the user and the distance estimated by the distance estimation means, and correcting at least one of the sound pressures acquired by the first and the second sound pressure acquisition means based on the calculated difference.

According to the aforementioned aspect, the distance estimation means may estimate the distance between the first or the second sound pressure acquisition means and the mouth of the user based on the sound pressures acquired by the first and the second sound pressure acquisition means and one of a distance correspondence map, a function, and a learning device, each of the distance correspondence map, the function, and the learning device adapted to indicate a relationship between the sound pressure acquired by each of the first and the second sound pressure acquisition means and the distance between the first or the second sound pressure acquisition means and the mouth of the user.

According to the aforementioned aspect, the sound pressure correction means may calculate a correction amount of the sound pressure acquired by at least one of the first and the second sound pressure acquisition means based on the difference and one of a correction amount correspondence map, a function, and a learning device, and calculate a corrected sound pressure by adding the calculated correction amount to the sound pressure acquired by at least one of the first and the second sound pressure acquisition means, each of the correction amount correspondence map, the function, and the learning device adapted to indicate a relationship between the difference and the correction amount of the sound pressure.

According to the aforementioned aspect, the sound analysis system may further include utterance determination means for determining whether or not a source of generation of the sound pressure is the user based on the ratio of the sound pressure acquired by the first sound pressure acquisition means to the sound pressure acquired by the second sound pressure acquisition means.

According to the aforementioned aspect, the sound analysis system may further include:

acceleration detection means disposed in the terminal main body worn by the user for detecting acceleration of the terminal main body;

calculation means for calculating at least one of the amplitude and the frequency of the terminal main body based on the acceleration detected by the acceleration detection means; and correction means for correcting at least one of the amplitude and the frequency of the terminal main body calculated by the calculation means based on the difference.

Another aspect of the present disclosure for attaining the aforementioned object is a sound analysis method including:

acquiring a sound pressure of a voice of a user by each of a first and a second sound pressure acquisition means disposed in an equipment worn by the user at positions that differ in a distance from a mouth of the user under the state in which the user is wearing the equipment;

estimating a distance between the first or the second sound pressure acquisition means and the mouth of the user based on the sound pressures acquired by the first and the second sound pressure acquisition means; and calculating a difference between a reference value of the distance between the first or the second sound pressure acquisition means and the mouth of the user and the estimated distance, and correcting at least one of the sound pressures acquired by the first and the second sound pressure acquisition means based on the calculated difference.

Another aspect of the present disclosure for attaining the aforementioned object is a program for causing a computer to execute the processes of:

acquiring a sound pressure of a voice of a user by each of a first and a second sound pressure acquisition means disposed in an equipment worn by the user at positions that differ in a distance from a mouth of the user under the state in which the user is wearing the equipment;

estimating a distance between the first or the second sound pressure acquisition means and the mouth of the user based on the sound pressures acquired by the first and the second sound pressure acquisition means; and calculating a difference between a reference value of the distance between the first or the second sound pressure acquisition means and the mouth of the user and the estimated distance, and correcting at least one of the sound pressures acquired by the first and the second sound pressure acquisition means based on the calculated difference.

According to the present disclosure, a sound analysis system, a sound analysis method, and a program that can suppress degradation in the accuracy of the detection of the sound pressure and perform voice analysis with high precision can be provided.

The above and other objects, features and advantages of the present disclosure will become more fully understood from the detailed description given hereinbelow and the accompanying drawings which are given by way of illustration only, and thus are not to be considered as limiting the present disclosure.

BRIEF DESCRIPTION OF DRAWINGS

FIG. 5 is a diagram showing an example of a distance correspondence map;

FIG. 6 is a diagram showing an example of a correction amount correspondence map;

DESCRIPTION OF EMBODIMENTS

First Embodiment

Figure 1:
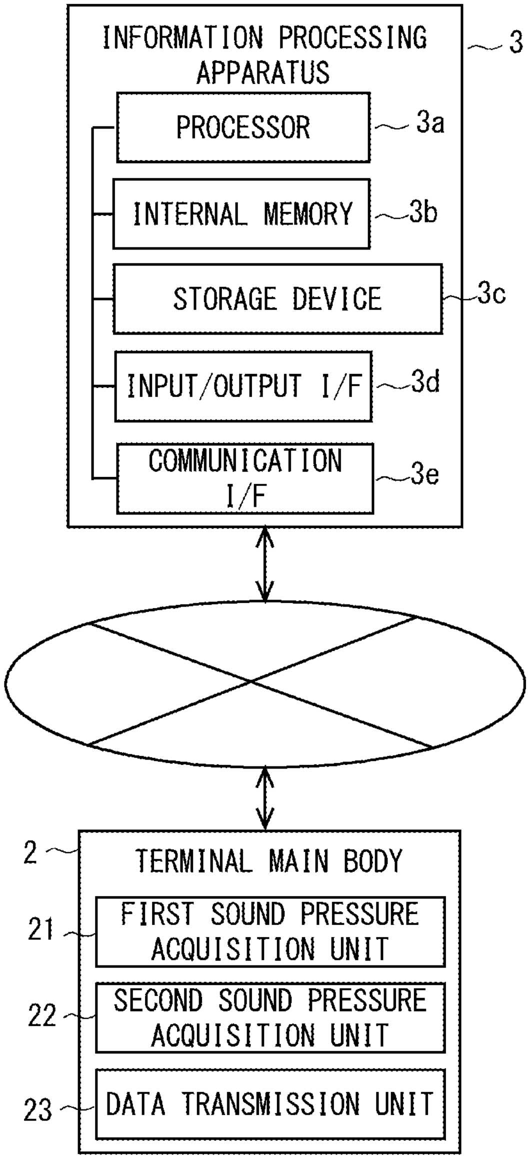
FIG. 1 is a block diagram showing a schematic system configuration of a sound analysis system according to a first embodiment.

Hereinbelow, embodiments of the present disclosure will be described with reference to the drawings. FIG. 1 is a block diagram showing a schematic system configuration of a sound analysis system according to a first embodiment. The sound analysis system according to the first embodiment includes a terminal main body 2 and an information processing apparatus 3 connected to the terminal main body 2 by a radio communication channel.

Examples of the radio communication channel include Wi-Fi (Wireless Fidelity) (registered trademark), Bluetooth (registered trademark), UWB (Ultra Wideband), and the like. The terminal main body 2 and the information processing apparatus 3 may be connected with each other via a communication network such as the internet. A plurality of terminal main bodies 2 may be connected with the information processing apparatus 3 via a communication network.

Figure 2:
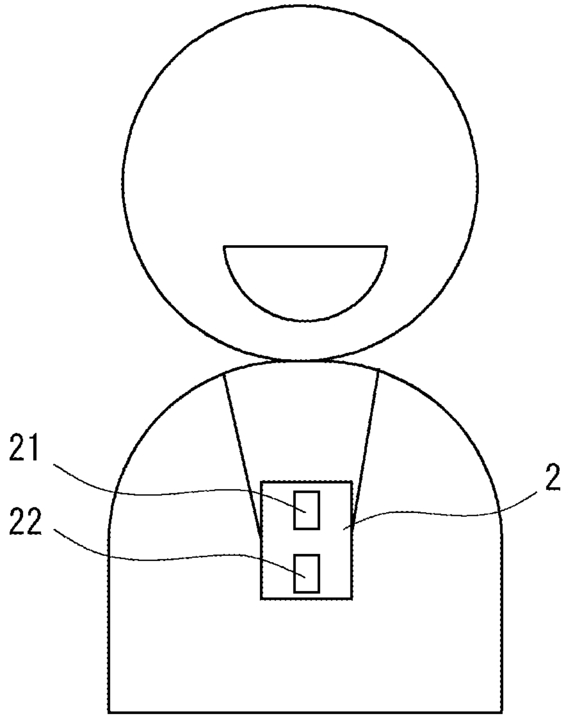
FIG. 2 is a diagram showing a terminal main body.

As an example of equipment worn by a user, a wearable terminal is given which is the terminal main body 2 hung from the user's neck as shown in FIG. 2. A strap is provided to the terminal main body 2. The user puts his/her head through the strap and hangs the terminal main body 2 from his/her neck.

The terminal main body 2 includes first and second sound pressure acquisition units 21 and 22 that acquire sound pressures of the sounds of the surrounding such as the user's voice, and a data transmission unit 23 that transmits the sound pressures acquired by the first and the second sound pressure acquisition units 21 and 22 to the information processing apparatus 3.

The terminal main body 2 includes the first and the second sound pressure acquisition units 21 and 22 spaced apart from each other by a prescribed interval. The first and the second sound pressure acquisition units 21 and 22 are specific examples of first and second pressure acquisition means. The second sound pressure acquisition unit 22 is disposed at a position that is farther away from the user's mouth than the first sound pressure acquisition unit 21 under the state in which the terminal main body 2 is hung from the user's neck.

Note that the first sound pressure acquisition unit 21 may be disposed at a position that is farther away from the user's mouth than the second sound pressure acquisition unit 22 under the state in which terminal main body 2 is hung from the user's neck. At least one of the first and the second sound pressure acquisition units 21 and 22 is attached to a strap or the like.

The first and the second sound pressure acquisition units 21 and 22 are each configured of a microphone for collecting voices and the like. The first and the second sound pressure acquisition units 21 and 22 output the acquired sound pressures to the data transmission unit 23. The data transmission unit 23 transmits data of the sound pressures output from the first and the second sound pressure acquisition units 21 and 22 to the information processing apparatus 3.

The information processing apparatus 3 has a hardware configuration of an ordinary computer including a processor 3*a* such as a CPU (Central Processing Unit) or a GPU (Graphics Processing Unit), an internal memory 3*b* such as a RAM (Random Access Memory) or a ROM (Read Only Memory), a storage device 3*c* such as a HDD (Hard Disk Drive) or a SDD (Solid State Drive), an input/output interface I/F3*d* for connecting with the peripheral equipment such as a display, and an communication interface I/F3*e* for performing communication with equipment disposed outside the apparatus.

The information processing apparatus 3 can implement various functions described below by, for instance, causing the processor 3*a* execute the programs stored in the storage device 3*c* and the internal memory 3*b* using the internal memory 3*b*.

Figure 3:
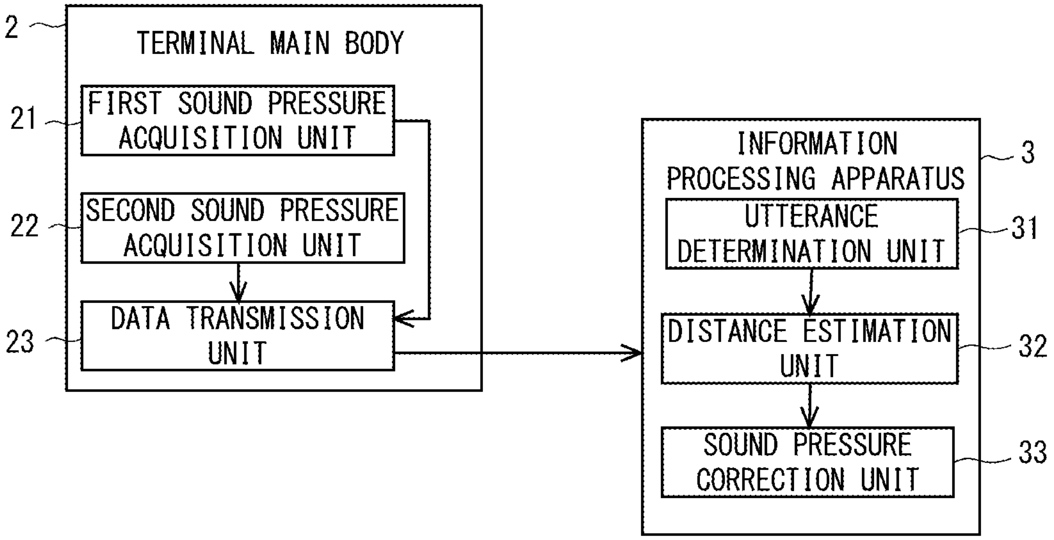
FIG. 3 is a block diagram showing a schematic system configuration of an information processing apparatus according to a first embodiment.

FIG. 3 is a block diagram showing a schematic system configuration of an information processing apparatus according to the first embodiment. The information processing apparatus 3 includes an utterance determination unit 31 that determines the person making the utterance, a distance estimation unit 32 that estimates a distance between the first sound pressure acquisition unit 21 and the user's mouth, and a sound pressure correction unit 33 that corrects the sound pressure.

The utterance determination unit 31 determines whether or not the source of generation of the sound pressures (hereinbelow referred to as the sound pressure generation source) output from the first and the second sound pressure acquisition units 21 and 22 is the user wearing the terminal main body 2 (hereinbelow referred to as terminal-mounting user). That is, the utterance determination unit 31 determines whether or not the terminal-mounting user made an utterance. From this determination, it is possible to specify the terminal-mounting user as the sound pressure generation source, and the sound pressure correction can be performed more precisely.

Figure 4:
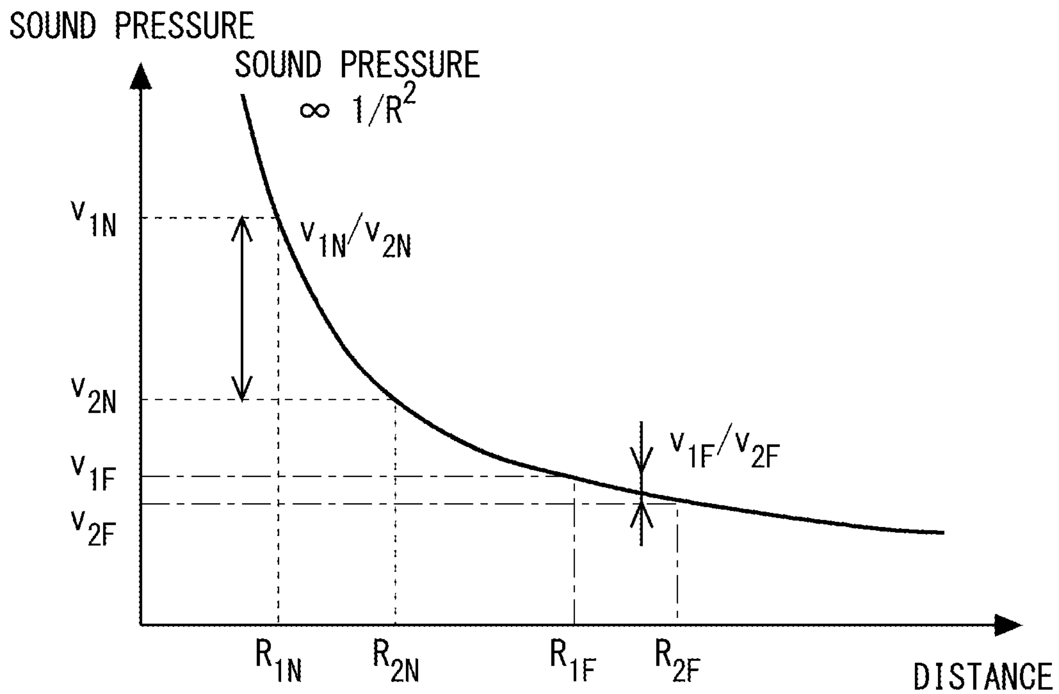
FIG. 4 is a diagram showing characteristics of the sound pressures.

As shown in FIG. 4, the sound pressure has a characteristic of being damped in accordance with the distance of the first and second sound pressure acquisition units 21 and 22 from the sound pressure generation source. Therefore, in the case where the terminal-mounting user makes an utterance, that is, when the sound pressure generation source is close to the sound pressure acquisition units 21 and 22, the sound pressure ratio becomes large compared to the sound pressure ratio in the case where another user makes an utterance, that is, when the sound pressure generation source is far from the sound pressure acquisition units 21 and 22.

In the case where the distance between the sound pressure generation source and each of the first and the second sound pressure acquisition units 21 and 22 is small, the sound pressure of the first sound pressure acquisition unit 21 is referred to as $V_{1N}$, the sound pressure of the second sound pressure acquisition unit 22 is referred to as $V_{2N}$, the distance between the first sound pressure acquisition unit 21 and the sound pressure generation source is referred to as $R_{1N}$, and the distance between the second sound pressure acquisition unit 22 and the sound pressure generation source is referred to as $R_{2N}$. Further, in the case where the distance between the sound pressure generation source and each of the first and the second sound pressure acquisition units 21 and 22 is large, the sound pressure of the first sound pressure acquisition unit 21 is referred to as $V_{1F}$, the sound pressure of the second sound pressure acquisition unit 22 is referred to as $V_{2F}$, the distance between the first sound pressure acquisition unit 21 and the sound pressure generation source is referred to as $R_{1F}$, and the distance between the second sound pressure acquisition unit 22 and the sound pressure generation source is referred to as $R_{2F}$.

In this case, as shown in FIG. 4, the sound pressure ratio $V_{1N}/V_{2N}$, which is the sound pressure ratio when the distance between the sound pressure generation source and each of the first and the second sound pressure acquisition units 21 and 22 is small, is larger than the sound pressure ratio $V_{1F}/V_{2F}$, which is the sound pressure ratio when the distance between the sound pressure generation source and each of the first and the second sound pressure acquisition units 21 and 22 is large ($V_{1N}/V_{2N}>V_{1F}/V_{2F}$).

By using the characteristics of the sound pressures, the utterance determination unit 31 can determine whether or not the sound pressure generation source is the terminal-mounting user based on the ratio of the sound pressure output from the first sound pressure acquisition unit 21 to the sound pressure output from the second sound pressure acquisition unit 22.

For instance, the utterance determination unit 31 calculates a first integral value obtained by integrating the sound pressure output from the first sound pressure acquisition unit 21 for a prescribed time $\Delta t$. The utterance determination unit 31 calculates a second integral value obtained by integrating the sound pressure output from the second sound pressure acquisition unit 22 for a prescribed time $\Delta t$. A prescribed time $\Delta t$ is a time obtained by extracting a part of the time during which the user is making an utterance, and the time is preset in the first and the second sound pressure acquisition units 21 and 22. The utterance determination unit 31 determines that the sound pressure generation source is the terminal-mounting user when it is judged that the ratio of the first integral value to the second integral value is larger than the preset threshold value.

The utterance determination unit 31 performs determination of the sound pressure generation source by comparing the ratio of the first integral value of the sound pressure acquired by the first sound pressure acquisition unit 21 to the second integral value of the sound pressure acquired by the second sound pressure acquisition unit 22 and the threshold value, however it is not limited thereto and any determination method may be employed. For instance, the utterance determination unit 31 may perform determination of the sound pressure generation source by comparing the ratio of the average value of the sound pressure acquired by the first sound pressure acquisition unit 21 to the sound pressure acquired by the second sound pressure acquisition unit 22 and the threshold value. Further, the utterance determination unit 31 may perform determination of the sound pressure generation source by comparing the integral values of the sound pressures acquired by the first and the second sound pressure acquisition units 21 and 22 or the difference between the average values of the sound pressures acquired by the first and the second sound pressure acquisition units 21 and 22 and the threshold value.

The distance estimation unit 32 estimates the distance between the first sound pressure acquisition unit 21 and the mouth of the terminal-mounting user. The distance estimation unit 32 is a specific example of distance estimation means. Here, the sound pressure v is determined by a function (v=f(V,R)) in which a sound volume V of the sound pressure generation source and a distance R between the sound pressure generation source and the sound pressure acquisition units are expressed as variables. Therefore, the distance R between the sound pressure generation source and the sound pressure acquisition units can be determined uniquely by using two independent sound pressures (v1, v2).

Therefore, the distance estimation unit 32 estimates the distance R between the first sound pressure acquisition unit 21 and the mouth of the terminal-mounting user based on the sound pressure v1 acquired by the first sound pressure acquisition unit 21, the sound pressure v2 acquired by the second sound pressure acquisition unit 22, and the preset distance correspondence map.

FIG. 5 is a diagram showing an example of a distance correspondence map. As shown in FIG. 5, a distance correspondence map is created in which the actual distance between the mouth of the terminal mounting user and the first sound pressure acquisition unit 21 is referred to as R and the sound pressures v1 and v2 acquired by the first and the second sound pressure acquisition units 21 and 22, respectively, are associated with the distance R. The distance correspondence map may be preset in the distance estimation unit 32.

For instance, when the sound pressure acquired by the first sound pressure acquisition unit 21 is v1=3.0 and the sound pressure acquired by the second sound pressure acquisition unit 22 is v2=2.8, the distance estimation unit 32 estimates the distance between the first sound pressure acquisition unit 21 and the mouth of the terminal-mounting user to be R=4.2 cm with reference to the distance correspondence map shown in FIG. 5.

The distance estimation unit 32 may estimate the distance R between the first sound pressure acquisition unit 21 and the mouth of the terminal-mounting user based on the sound pressures v1 and v2 acquired by the first and the second sound pressure acquisition units 21 and 22, respectively, and the preset function. The distance R between the user's mouth and the first sound pressure acquisition unit 21 and the aforementioned function R=f(v1, v2) indicating the relationship between the sound pressures v1 and v2 acquired by the first and the second sound pressure acquisition units 21 and 22, respectively, may be set in the distance estimation unit 32.

The distance estimation unit 32 may estimate the distance R between the user's mouth and the first sound pressure acquisition unit 21 using a learning device that has learned the relationship between the distance R between the user's mouth and the first sound pressure acquisition unit 21 and the sound pressures v1 and v2 acquired by the first and the second sound pressure acquisition units 21 and 22, respectively.

The learning device performs machine learning using the sound pressures v1 and v2 acquired by the first and the second sound pressure acquisition units 21 and 22, respectively, as input values thereof and the distance R between the user's mouth and the first sound pressure acquisition unit 21 as an output value thereof.

The learning device is configured of, for instance, a neural network such as an RNN (Recurrent neural Network). The RNN may include an LSTM (Long Short Term Memory) in an intermediate layer thereof. The learning device may be configured of another learning device such as an SVM (Support Vector Machine) in place of the neural network.

The sound pressure correction unit 33 performs correction of at least one of the sound pressure v1 acquired by the first sound pressure acquisition unit 21 and the sound pressure v2 acquired by the second sound pressure acquisition unit 22. The sound pressure correction unit 33 is a specific example of sound pressure correction means. For instance, the sound pressure correction unit 33 calculates a difference ΔR between the reference value of the distance between the first sound pressure acquisition unit 21 and the mouth of the terminal-mounting user and the distance R estimated by the distance estimation unit 32. The reference value of the distance (hereinbelow referred to as a distance reference value) between the first sound pressure acquisition unit 21 and the mouth of the terminal-mounting user is, for instance, the distance between the first sound pressure acquisition unit 21 serving as the reference and the mouth of the terminal-mounting user that has been measured when the terminal main body 2 is hung straight down from the neck of the terminal-mounting user with a strap without the strap being twisted. The distance reference value is preset in the sound pressure correction unit 33.

The sound pressure correction unit 33 calculates the correction amount Δv of the sound pressures acquired by the first and the second sound pressure acquisition units 21 and 22 based on the calculated difference ΔR and the correction amount correspondence map. The correspondence relationship between the difference ΔR and the correction amount Δv of the sound pressures acquired by the first and the second sound pressure acquisition units 21 and 22 is experimentally obtained in advance and set in the sound pressure correction unit 33 as the correction amount correspondence map. FIG. 6 is a diagram showing an example of the correction amount correspondence map.

The sound pressure correction unit 33 adds the calculated correction amount Δv to the sound pressures v1 and v2 acquired by the first and the second sound pressure acquisition units 21 and 22, respectively, to thereby calculate the sound pressures of the first and the second sound pressure acquisition units 21 and 22 after the correction (hereinbelow referred to as a corrected sound pressure).

For instance, as shown in FIG. 6, when the difference ΔR is 0.5, the sound pressure correction unit 33 brings the correction amount Δv to 0.1 by referring to the correction amount correspondence map. The sound pressure correction unit 33 adds the correction amount 0.1 to the sound pressure 3.0 acquired by the first sound pressure acquisition unit 21 to thereby calculate the corrected sound pressure 3.1 of the first sound pressure acquisition unit 21.

The distance estimation unit 32 may estimate the distance between the second sound pressure acquisition unit 22 and the mouth of the terminal-mounting user. In such case, the actual distance between the mouth of the terminal mounting user and the second sound pressure acquisition unit 22 is referred to as R, and the sound pressures v1 and v2 acquired by the first and the second sound pressure acquisition units 21 and 22, respectively, are associated with the distance R, to thereby create the distance correspondence map. The distance estimation unit 32 estimates the distance R between the second sound pressure acquisition unit 22 and the mouth of the terminal-mounting user based on the distance correspondence map that has been created.

The sound pressure correction unit 33 calculates the difference ΔR between the distance reference value of the distance between the second sound pressure acquisition unit 22 and the mouth of the terminal-mounting user and the distance R estimated by the distance estimation unit 32. The sound pressure correction unit 33 calculates the correction amount Δv of the sound pressures acquired by the first and the second sound pressure acquisition units 21 and 22 based on the calculated difference ΔR and the correction amount correspondence map.

The sound pressure correction unit 33 may calculate the correction amount Δv of the sound pressures acquired by the first and the second sound pressure acquisition units 21 and 22 based on the calculated difference ΔR and the function indicating the relationship between the difference ΔR and the correction amount Δv.

The sound pressure correction unit 33 may calculate the correction amount Δv of the sound pressures acquired by the first and the second sound pressure acquisition units 21 and 22 using the learning device that has learned the relationship between the difference ΔR and the correction amount Δv. The learning device performs machine learning using the difference ΔR as an input value thereof and the correction amount Δv of the sound pressures acquired by the first and the second sound pressure acquisition units 21 and 22 as an output value thereof.

The sound pressure correction unit 33 adds the calculated correction amount Δv to the sound pressures v1 and v2 acquired by the first and the second sound pressure acquisition units 21 and 22, respectively, to thereby calculate the corrected sound pressures of the first and the second sound pressure acquisition units 21 and 22. Alternatively, the sound pressure correction unit 33 may add the calculated correction amount Δv to the sound pressure acquired by the first or the second sound pressure acquisition unit 21 or 22 to thereby calculate the corrected sound pressure of the first or the second sound pressure acquisition unit 21 or 22.

For instance, under the environment where the person making an utterance is specified by the terminal-mounting user, the information processing apparatus 3 may be configured so as to not to include the utterance determination unit 31. In such case, determination of the sound pressure generation source is not made, and the distance estimation unit 32 estimates the distance between the first sound pressure acquisition unit 21 and the mouth of the terminal-mounting user and the sound pressure correction unit 33 calculates the corrected sound pressures of the first and the second sound pressure acquisition units 21 and 22. By this configuration, the processing can be simplified even more.

Figure 7:
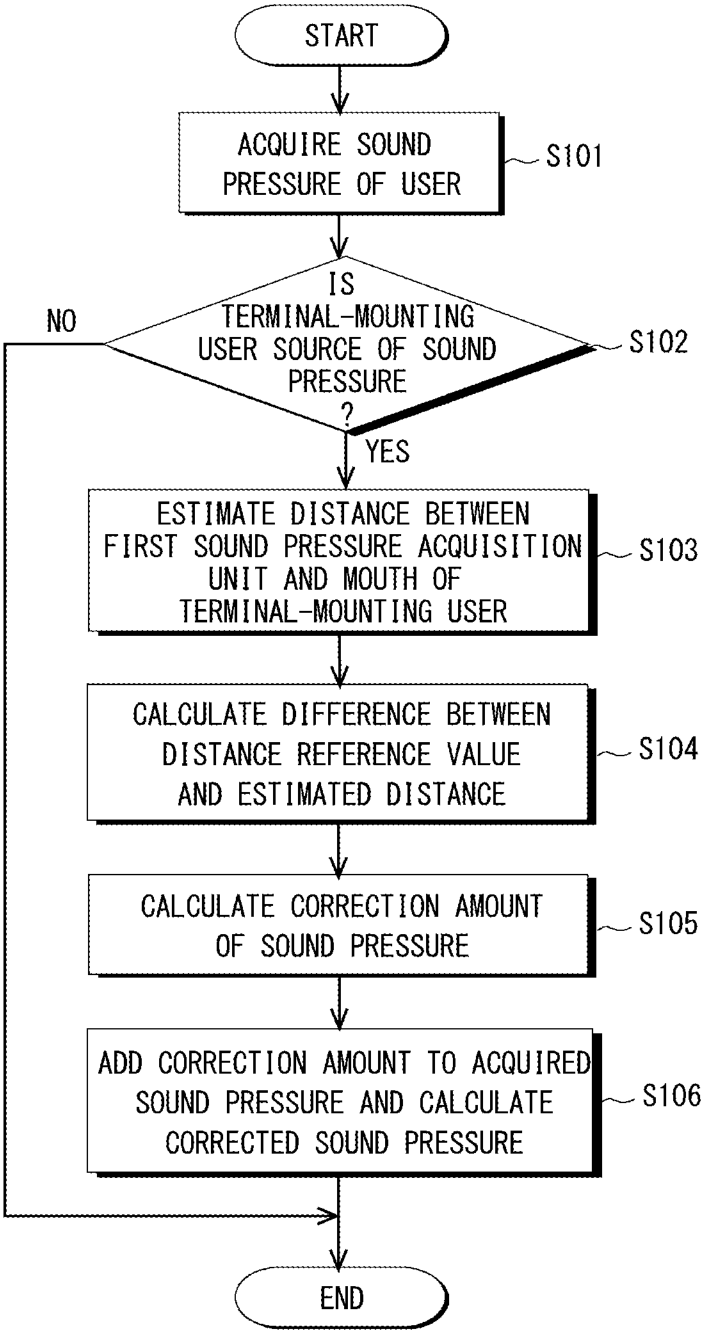
FIG. 7 is a flowchart showing an example of a flow of a sound analysis method according to the first embodiment.

Next, a sound analysis method according to the first embodiment will be described. FIG. 7 is a flowchart showing an example of a flow of the sound analysis method according to the first embodiment.

The first and the second sound pressure acquisition units 21 and 22 acquire the sound pressures of the user (Step S101) and output the acquired sound pressures to the data transmission unit 23. The data transmission unit 23 transmits the sound pressures output from the first and the second sound pressure acquisition units 21 and 22 to the information processing apparatus 3.

The utterance determination unit 31 determines whether or not the sound pressure generation source is the terminal-mounting user based on the ratio of the sound pressure output from the first sound pressure acquisition unit 21 to the sound pressure output from the second sound pressure acquisition unit 22 (Step S102).

The utterance determination unit 31 ends the processing when it determines that the sound pressure generation source is not the terminal-mounting user (NO in Step S102).

On the other hand, when the utterance determination unit 31 determines that the sound pressure generating source is the terminal-mounting user (YES in Step S102), the distance estimation unit 32 estimates the distance between the first sound pressure acquisition unit 21 and the mouth of the terminal-mounting user based on the sound pressures acquired by the first and the second sound pressure acquisition units 21 and 22, and the distance correspondence map (Step S103).

The sound pressure correction unit 33 calculates the difference between the distance reference value of the distance between the first sound pressure acquisition unit 21 and the mouth of the terminal-mounting user and the distance estimated by the distance estimation unit 32 (Step S104). The sound pressure correction unit 33 calculates the correction amount of the sound pressures acquired by the first and the second sound pressure acquisition units 21 and 22 based on the calculated difference and the correction amount correspondence map (Step S105).

The sound pressure correction unit 33 adds the correction amount calculated above to the sound pressures v1 and v2 acquired by the first and the second sound pressure acquisition units 21 and 22, respectively, to thereby calculate the corrected sound pressures of the first and the second sound pressure acquisition units 21 and 22 (Step S106).

As described above, the sound analysis system according to the first embodiment includes the first and the second sound pressure acquisition units 21 and 22, the distance estimation unit 32, and the sound pressure correction unit 33. The first and the second sound pressure acquisition units 21 and 22 are each disposed in the equipment worn by the user at positions that differ in the distance from the user's mouth under the state in which the user is wearing the equipment and each acquire the sound pressure of the user' voice. The distance estimation unit 32 estimates the distance between the first sound pressure acquisition unit 21 or the second sound pressure acquisition unit 22 and the user's mouth based on the sound pressures acquired by the first and the second sound pressure acquisition units 21 and 22. The sound pressure correction unit 33 calculates the difference between the reference value of the distance between the first or the second sound pressure acquisition unit 21 or 22 and the user's mouth and the distance estimated by the distance estimation unit 32, and corrects at least one of the sound pressures acquired by the first and the second sound pressure acquisition units 21 and 22 based on the calculated difference.

By this configuration, even when the distance between the user's mouth and each of the first and the second sound pressure acquisition units 21 and 22 changes, the sound pressure can be corrected in accordance with the change in the distance. Therefore, it is possible to perform sound analysis with high precision by suppressing degradation in the accuracy of the detection of the sound pressure.

Second Embodiment

Figure 8:
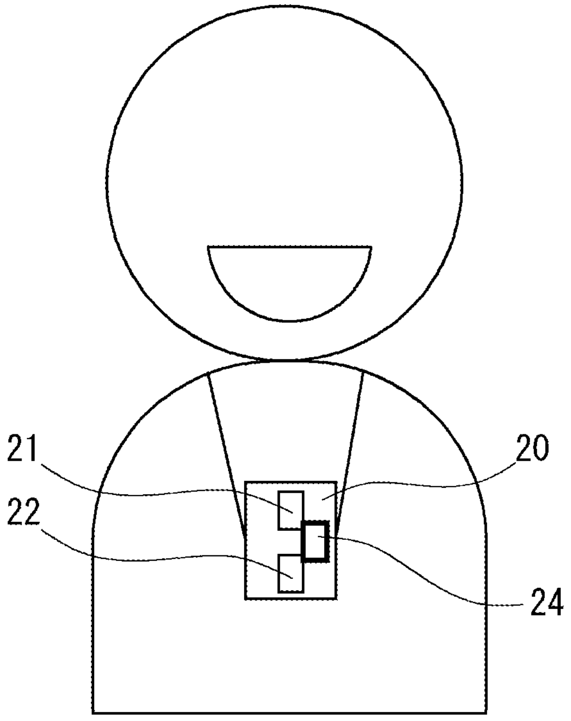
FIG. 8 is a diagram showing a terminal main body according to a second embodiment.

In the second embodiment, as shown in FIG. 8, an acceleration sensor 24 is further disposed in the terminal main body 20 in addition to the first and the second sound pressure acquisition units 21 and 22. The acceleration sensor 24 detects acceleration of the terminal main body 20. Based on the acceleration detected by the acceleration sensor 24, the amplitude and the cycle of the terminal main body 20 are calculated, to thereby estimate and the motion (e.g. nodding) of the terminal-mounting user. At this time, in accordance with the principle of pendulum, the amplitude and the cycle of the terminal main body 20 change due to the change in the length of the strap even though the motion of the terminal-mounting user is the same. Therefore, it is desirable that the amplitude and the cycle of the terminal main body 20 are corrected in accordance with the length of the strap.

The voice analysis system according to the second embodiment corrects at least one of the amplitude and the cycle of the terminal main body 20 based on the difference ΔR that changes in accordance with the length of the strap.

Figure 9:
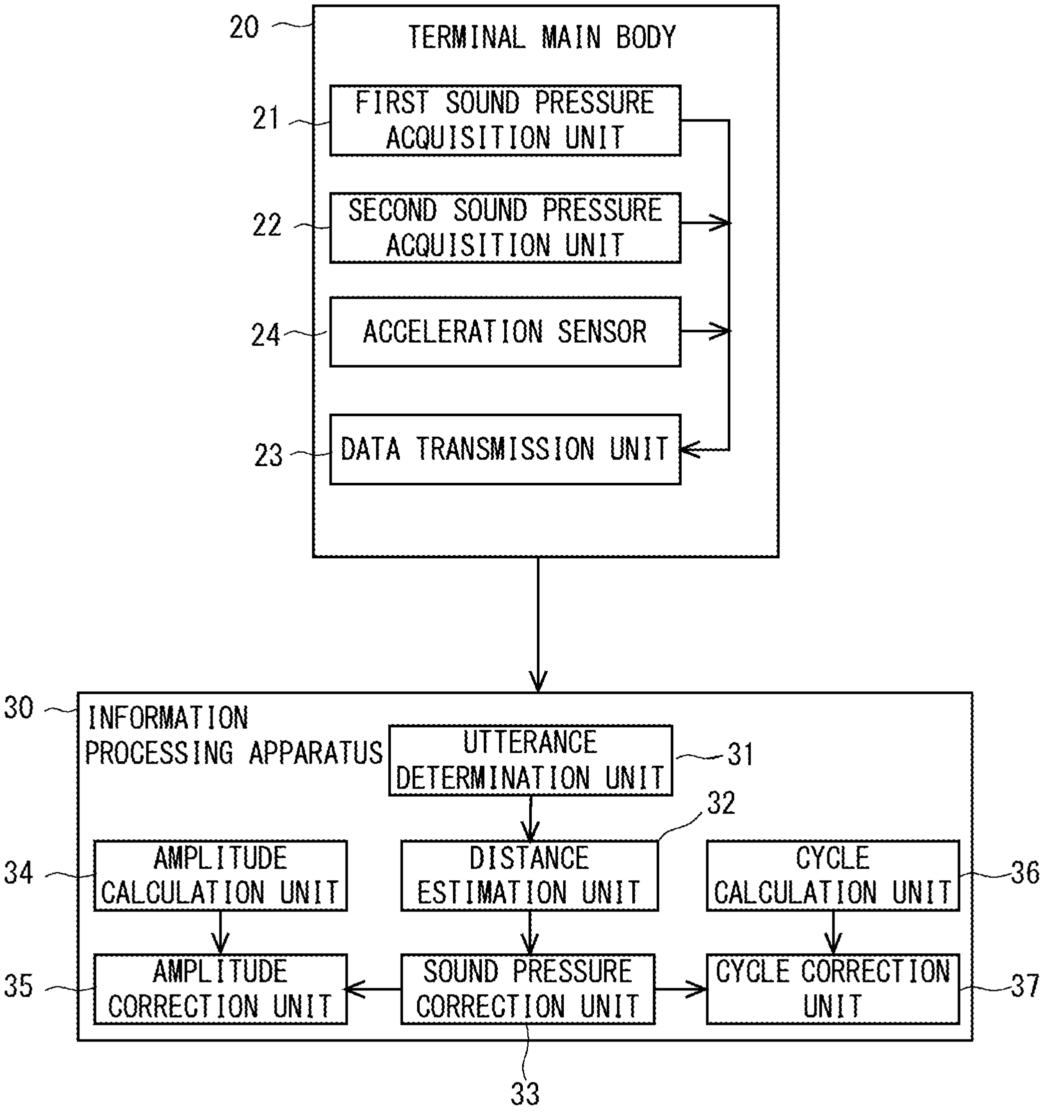
FIG. 9 is a block diagram showing a schematic system configuration of an information processing apparatus according to the second embodiment.

FIG. 9 is a block diagram showing a schematic system configuration of an information processing apparatus according to the second embodiment. The information processing apparatus 30 according to the second embodiment includes an amplitude calculation unit 34, an amplitude correction unit 35, a cycle calculation unit 36, and a cycle correction unit 37 in addition to the utterance determination unit 31, the distance estimation unit 32, and the sound pressure correction unit 33 described above.

The amplitude calculation unit 34 calculates the amplitude of the terminal main body 20 based on the acceleration detected by the acceleration sensor 24. The amplitude calculation unit 34 is a specific example of calculation means. The amplitude correction unit 35 corrects the amplitude of the terminal main body calculated by the amplitude calculation unit 34. The amplitude correction unit 35 is a specific example of correction means.

For instance, the amplitude correction unit 35 calculates the correction amount of the amplitude calculated by the amplitude calculation unit 34 based on the difference ΔR and the correction amount correspondence map. The correspondence relationship between the difference ΔR and the correction amount of the amplitude calculated by the amplitude calculation unit 34 is experimentally obtained in advance and set in the amplitude correction unit 35 as the correction amount correspondence map. Note that the amplitude correction unit 35 may calculate the correction amount of the amplitude using a function or a learning device indicating the relationship between the difference ΔR and the correction amount of the amplitude calculated by the amplitude calculation unit 34. The amplitude correction unit 35 adds the correction amount calculated above to the amplitude calculated by the amplitude calculation unit 34 to thereby calculate the corrected amplitude.

In the similar manner, the cycle calculation unit 36 calculates the cycle of the terminal main body 20 based on the acceleration detected by the acceleration sensor 24. The cycle calculation unit 36 is a specific example of calculation means. The cycle correction unit 37 corrects the cycle calculated by the cycle calculation unit 36. The cycle correction unit 37 is a specific example of correction means.

For instance, the cycle correction unit 37 calculates the correction amount of the cycle calculated by the cycle calculation unit 36 based on the difference ΔR and the correction amount correspondence map. The correspondence relationship between the difference ΔR and the correction amount of the cycle calculated by the cycle calculation unit 36 is experimentally obtained in advance and set in the cycle correction unit 37 as the correction amount correspondence map. Note that the cycle correction unit 37 may calculate the correction amount of the cycle using a function or a learning device indicating the relationship between the difference ΔR and the correction amount of the cycle calculated by the cycle calculation unit 36. The cycle correction unit 37 adds the correction amount calculated above to the cycle calculated by the cycle calculation unit 36 to thereby calculate the corrected cycle.

Further, the terminal main body 20 may include, for instance, sensors such as a heart rate sensor, a number-of-steps counting sensor, and the like in addition to the acceleration sensor 24. In this case as well, in the case where the value acquired by the instant sensor changes in accordance with the distance between the sensor and the mouth of the terminal-mounting user, it is possible to perform correction by the same method as that described above.

In the second embodiment, the identical reference symbols denote identical parts as those described in the first embodiment described above and redundant explanations thereof are omitted.

Several embodiments of the present disclosure have been described. However, the embodiments are mere examples and are not intended to limit the scope of the present disclosure. These novel embodiments can be implemented in various forms other that those described above, and can be naturally omitted, replaced, and changed without departing from the gist of the present disclosure. The embodiments and the modifications thereof are included in the scope and the gist of the present disclosure as well as the scope of the disclosure disclosed in the claims and the equivalents thereof.

For instance, in the aforementioned embodiments, at least one of the utterance determination unit 31, the distance estimation unit 32, the sound pressure correction unit 33, the amplitude calculation unit 34, the amplitude correction unit 35, the cycle calculation unit 36, and the cycle correction unit 37 may be disposed in the terminal main body 2.

Figure 10:
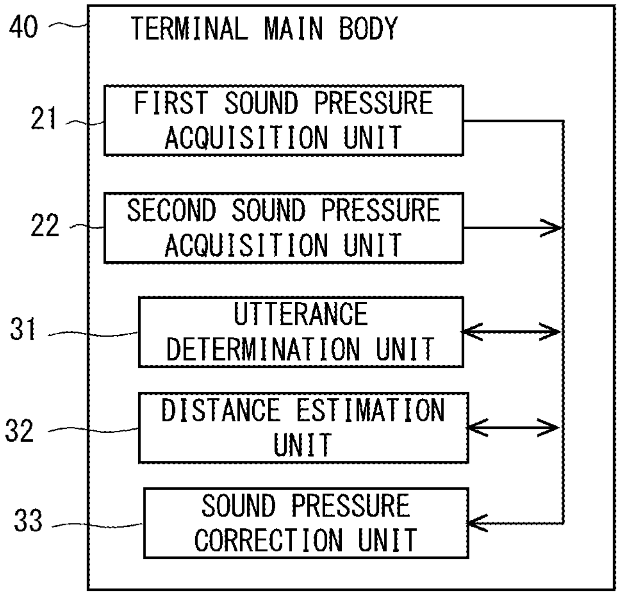
FIG. 10 is a diagram showing a configuration in which an utterance determination unit, a distance estimation unit, and a sound pressure correction unit are disposed in a terminal main body.

FIG. 10 is a diagram showing a configuration in which an utterance determination unit, a distance estimation unit, and a sound pressure correction unit are disposed in the terminal main body. In this case, there is no need to perform the processing by the information processing apparatus 3, and thus the terminal main body 40 does not have to include the data transmission unit 23. Therefore, the configuration of the sound analysis system can be simplified even more.

Further, in the aforementioned embodiments, the terminal main body 2 is configured as a wearable terminal that is hung from the user's neck with a strap, but it is not limited thereto. The terminal main body 2 may be configured as a wearable terminal incorporated in, for instance, a necklace, a pair of glasses (including sunglasses), an earphone, a head gear, a bracelet, or a clothing. Note that in any of the configurations, like in the aforementioned first and second embodiments, the first and the second sound pressure acquisition units 21 and 22 are disposed to the wearable terminal worn by the user at positions that differ in the distance from the user's mouth under the state in which the user is wearing the wearable terminal.

In the present disclosure, the processing shown in FIG. 6 can be implemented by causing the processor 3*a* execute the computer programs.

The program includes instructions (or software codes) that, when loaded into a computer, cause the computer to perform one or more of the functions described in the embodiments. The program may be stored in a non-transitory computer readable medium or a tangible storage medium. By way of example, and not a limitation, non-transitory computer readable media or tangible storage media can include a random-access memory (RAM), a read-only memory (ROM), a flash memory, a solid-state drive (SSD) or other types of memory technologies, a CD-ROM, a digital versatile disc (DVD), a Blu-ray disc or other types of optical disc storage, and magnetic cassettes, magnetic tape, magnetic disk storage or other types of magnetic storage devices.

The program may be transmitted on a transitory computer readable medium or a communication medium. By way of example, and not a limitation, transitory computer readable media or communication media can include electrical, optical, acoustical, or other forms of propagated signals.

Each of the parts that configure the information processing apparatus 3 according to each of the aforementioned embodiments is not only implemented by a program, and a part or all of the parts that configure the information processing apparatus 3 can also be implemented by an exclusive hardware such as ASIC (Application Specific Integrated Circuit) or FPGA (Field-Programmable Gate Array).

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A sound analysis system comprising:

first and second sound pressure acquisition means for respectively acquiring a sound pressure of a voice of a user and disposed in an equipment worn by the user at positions that differ in a distance from a mouth of the user under a state in which the user is wearing the equipment;

distance estimation means for estimating a distance between either the first or the second sound pressure acquisition means and the mouth of the user based on the sound pressures acquired by the first and the second sound pressure acquisition means and a distance correspondence map adapted to indicate a relationship between the sound pressure acquired by each of the first and the second sound pressure acquisition means and the distance between the first or the second sound pressure acquisition means and the mouth of the user; and sound pressure correction means for calculating a difference between a reference value of the distance between the first or the second sound pressure acquisition means and the mouth of the user and the distance estimated by the distance estimation means, and correcting at least one of the sound pressures acquired by the first and the second sound pressure acquisition means based on the calculated difference.

2. The sound analysis system according to claim 1, wherein the sound pressure correction means calculates a correction amount of the sound pressure acquired by at least one of the first and the second sound pressure acquisition means based on the difference and one of a correction amount correspondence map, a function, and a learning device, and calculates a corrected sound pressure by adding the calculated correction amount to the sound pressure acquired by at least one of the first and the second sound pressure acquisition means, each of the correction amount correspondence map, the function, and the learning device adapted to indicate a relationship between the difference and the correction amount of the sound pressure.

3. The sound analysis system according to claim 1, further comprising utterance determination means for determining whether or not a source of generation of the sound pressure is the user based on a ratio of the sound pressure acquired by the first sound pressure acquisition means to the sound pressure acquired by the second sound pressure acquisition means.

4. The sound analysis system according to claim 1, further comprising:

acceleration detection means disposed in the equipment worn by the user for detecting acceleration of the equipment;

calculation means for calculating at least one of an amplitude and a frequency of the equipment based on the acceleration detected by the acceleration detection means; and correction means for correcting at least one of the amplitude and the frequency of the equipment calculated by the calculation means based on the difference.

5. A sound analysis method comprising:

acquiring a sound pressure of a voice of a user by each of first and second sound pressure acquisition means disposed in an equipment worn by the user at positions that differ in a distance from a mouth of the user under a state in which the user is wearing the equipment;

estimating a distance between the first or the second sound pressure acquisition means and the mouth of the user based on the sound pressures acquired by the first and the second sound pressure acquisition means and a distance correspondence map adapted to indicate a relationship between the sound pressure acquired by each of the first and the second sound pressure acquisition means and the distance between the first or the second sound pressure acquisition means and the mouth of the user; and calculating a difference between a reference value of the distance between the first or the second sound pressure acquisition means and the mouth of the user and the estimated distance, and correcting at least one of the sound pressures acquired by the first and the second sound pressure acquisition means based on the calculated difference.

6. A non-transitory computer readable medium storing a program for causing a computer to execute the processes of:

acquiring a sound pressure of a voice of a user by each of a first and a second sound pressure acquisition means disposed in an equipment worn by the user at positions that differ in a distance from a mouth of the user under a state in which the user is wearing the equipment;

estimating a distance between the first or the second sound pressure acquisition means and the mouth of the user based on the sound pressures acquired by the first and the second sound pressure acquisition means and a distance correspondence map adapted to indicate a relationship between the sound pressure acquired by each of the first and the second sound pressure acquisition means and the distance between the first or the second sound pressure acquisition means and the mouth of the user; and calculating a difference between a reference value of the distance between the first or the second sound pressure acquisition means and the mouth of the user and the estimated distance, and correcting at least one of the sound pressures acquired by the first and the second sound pressure acquisition means based on the calculated difference.

7. A sound analysis system comprising:

first and second sound pressure acquisition units configured to respectively acquire a sound pressure of a voice of a user and disposed in an equipment worn by the user at positions that differ in a distance from a mouth of the user under a state in which the user is wearing the equipment;

a distance estimation unit configured to estimate a distance between either the first or the second sound pressure acquisition unit and the mouth of the user based on the sound pressures acquired by the first and the second sound pressure acquisition units and a distance correspondence map adapted to indicate a relationship between the sound pressure acquired by each of the first and the second sound pressure acquisition units and the distance between the first or the second sound pressure acquisition unit and the mouth of the user; and a sound pressure correction unit configured to calculate a difference between a reference value of the distance between the first or the second sound pressure acquisition unit and the mouth of the user and the distance estimated by the distance estimation unit, and correcting at least one of the sound pressures acquired by the first and the second sound pressure acquisition units based on the calculated difference.

* * * * *